US007508228B2

(12) United States Patent
Walker et al.

(10) Patent No.: US 7,508,228 B2
(45) Date of Patent: Mar. 24, 2009

(54) METHOD AND SYSTEM FOR MONITORING TEST SIGNALS FOR SEMICONDUCTOR DEVICES

(75) Inventors: Ernest P. Walker, Weston, MA (US); Ronald A. Sartschev, Dunstable, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/321,288

(22) Filed: Dec. 21, 2005

(65) Prior Publication Data

US 2006/0279310 A1 Dec. 14, 2006

Related U.S. Application Data

(60) Provisional application No. 60/637,975, filed on Dec. 21, 2004.

(51) Int. Cl.
*G01R 31/26* (2006.01)
(52) U.S. Cl. ..................... 324/765; 324/158.1
(58) Field of Classification Search ............... 324/763, 324/765, 158.1, 73.1; 714/724–733; 327/180, 327/109, 111
See application file for complete search history.

(56) References Cited

U.S. PATENT DOCUMENTS

| | | | |
|---|---|---|---|
| 4,998,026 A | | 3/1991 | King |
| 5,101,153 A | * | 3/1992 | Morong, III ................. 324/537 |
| 5,115,152 A | * | 5/1992 | Nishimura ................... 327/62 |
| 5,200,696 A | | 4/1993 | Menis et al. |
| 5,514,976 A | | 5/1996 | Ohmura |
| 5,521,493 A | | 5/1996 | Persons |
| 5,617,035 A | | 4/1997 | Swapp |
| 5,754,041 A | | 5/1998 | Kaito et al. |
| 5,872,908 A | * | 2/1999 | Whetsel ....................... 714/30 |
| 5,917,331 A | * | 6/1999 | Persons ....................... 324/765 |
| 6,331,783 B1 | * | 12/2001 | Hauptman ................... 324/764 |
| 6,404,220 B1 | * | 6/2002 | Hashimoto ................... 324/765 |
| 6,486,715 B2 | * | 11/2002 | Gongwer et al. ............. 327/111 |
| 6,498,473 B1 | | 12/2002 | Yamabe |
| 6,677,775 B2 | | 1/2004 | Babcock |
| 6,687,868 B1 | * | 2/2004 | Furukawa et al. ............ 714/740 |
| 6,762,643 B2 | * | 7/2004 | Milanesi ......................... 330/9 |
| 6,828,775 B2 | | 12/2004 | Chow et al. |
| 6,836,136 B2 | * | 12/2004 | Aghaeepour ................. 324/765 |
| 6,859,902 B1 | | 2/2005 | Dalal et al. |
| 6,879,175 B2 | * | 4/2005 | Conner ....................... 324/765 |
| 6,885,213 B2 | * | 4/2005 | Sunter ........................ 324/765 |
| 7,292,788 B2 | | 11/2007 | Triebes et al. |

(Continued)

OTHER PUBLICATIONS

Mercury, System on a Chip, 50 MHz Octal Pin Electronics with PMU; Planet ATE; Nov. 22, 2004.

(Continued)

*Primary Examiner*—Ha Tran T Nguyen
*Assistant Examiner*—Arleen M Vazquez
(74) *Attorney, Agent, or Firm*—Fish & Richardson P.C.

(57) ABSTRACT

A semiconductor device tester includes a parametric measurement unit (PMU) driver circuit that provides a DC test signal for testing a semiconductor device, and a feedback circuit that senses the DC test signal at an output of the PMU driver circuit and sends the sensed DC test signal to an input of the PMU driver circuit for compensating the DC test signal.

18 Claims, 8 Drawing Sheets

U.S. PATENT DOCUMENTS

| | | |
|---|---|---|
| 7,330,009 B2 | 2/2008 | Andoh et al. |
| 7,436,171 B2 | 10/2008 | Lou et al. |
| 2005/0189950 A1 | 9/2005 | Lu |

OTHER PUBLICATIONS

Neptune, SOC Pin Electronics Companion PMU/DAC/Resistive Load; Planet ATE; Jun. 16, 2004.

Pluto, Octal PMU/VI with Ganging 5 MHz Pin Electronics; Planet ATE; Oct. 28, 2004.

Saturn, System on a Chip, Dual Channel Wide Voltage Pin Electronics Solution; Planet ATE; Jul. 19, 2005.

Venus, System on a Chip, Dual Channel 133 MHz Pin Electronics Solution; Planet ATE; Sep. 16, 2004.

Pluto, Octal PMU/VI with Ganging 5 MHz Pin Electronics; Planet ATE; May 6, 2005.

* cited by examiner

METHOD AND SYSTEM FOR MONITORING TEST SIGNALS FOR SEMICONDUCTOR DEVICES

TECHNICAL FIELD

This disclosure relates to the testing of semiconductor devices and, more particularly, to the monitoring of test signals sent to semiconductor devices under test.

BACKGROUND

As the commercial demand for semiconductor devices (e.g., memory chips and microprocessors) increases, testing of these devices has become critical for device manufacturers. By testing the semiconductor devices prior to shipping to their customers, defective or under-performing devices may be detected and removed. To perform such tests, semiconductor device testers such as automatic test equipment (ATE) may be used to characterize and validate the performance of manufactured semiconductor devices.

For some types of tests, the ATE may send two types of signals to a device-under-test (DUT). Direct current (DC) signals are sent into the DUT for measuring device characteristics, such as input and output impedance, leakage current, and DUT performance. To produce and send these DC signals, the ATE includes a parametric measurement unit (PMU). The ATE also generates and sends alternating current (AC) signals to the DUT that (for some test scenarios) simulate digital input signals. These simulated digital signals, for example, may be input into a memory chip under test. After storing the digital values represented by the digital signals, the values are retrieved (at a later time) to determine if the DUT has properly stored the values. To generate and send the AC test signals, the ATE includes additional circuitry known as Pin Electronics (PE) circuitry that typically operates at higher processor speeds compared to the PMU circuitry. Due to the slower operating PMU circuitry, PMU tests typically need more test time to complete.

SUMMARY OF THE DISCLOSURE

In accordance with an aspect of the disclosure, a semiconductor device tester includes a parametric measurement unit (PMU) driver circuit that provides a DC test signal for testing a semiconductor device, and a feedback circuit that senses the DC test signal at an output of the PMU driver circuit and sends the sensed DC test signal to an input of the PMU driver circuit for compensating the DC test signal.

In one embodiment, the feedback circuit may include a switch for passing the sensed DC test signal to the input of the PMU driver circuit. The feedback circuit may also include a conductor that is connected to the output of the PMU driver circuit. Furthermore, the switch may be connected to the output of the PMU driver circuit. In some arrangements, the switch may be connected to the output of the PMU driver circuit and to the input of the PMU driver circuit. To compensate the DC test signal, the PMU driver circuit may compare the sensed DC test signal to an input signal of the PMU driver circuit.

In accordance with another aspect, a method of monitoring signals for testing a semiconductor device includes sensing a DC test signal present at an output of a parametric measurement unit (PMU) driver circuit, and sending the sensed DC test signal to an input of the PMU driver circuit for compensating the DC test signal.

In another embodiment, sending the sensed DC test signal may include passing the sensed DC test signal through a switch. Sending the sensed DC test signal may also include passing the signal through an amplifier. Compensating the DC test signal may include comparing the sensed DC test signal to a signal present at an input of the PMU driver circuit.

Additional advantages and aspects of the present disclosure will become readily apparent to those skilled in the art from the following detailed description, wherein embodiments of the present invention are shown and described, simply by way of illustration of the best mode contemplated for practicing the present invention. As will be described, the present disclosure is capable of other and different embodiments, and its several details are susceptible of modification in various obvious respects, all without departing from the spirit of the present disclosure. Accordingly, the drawings and description are to be regarded as illustrative in nature, and not as limitative.

DETAILED DESCRIPTION OF THE EMBODIMENTS

Figure 1:
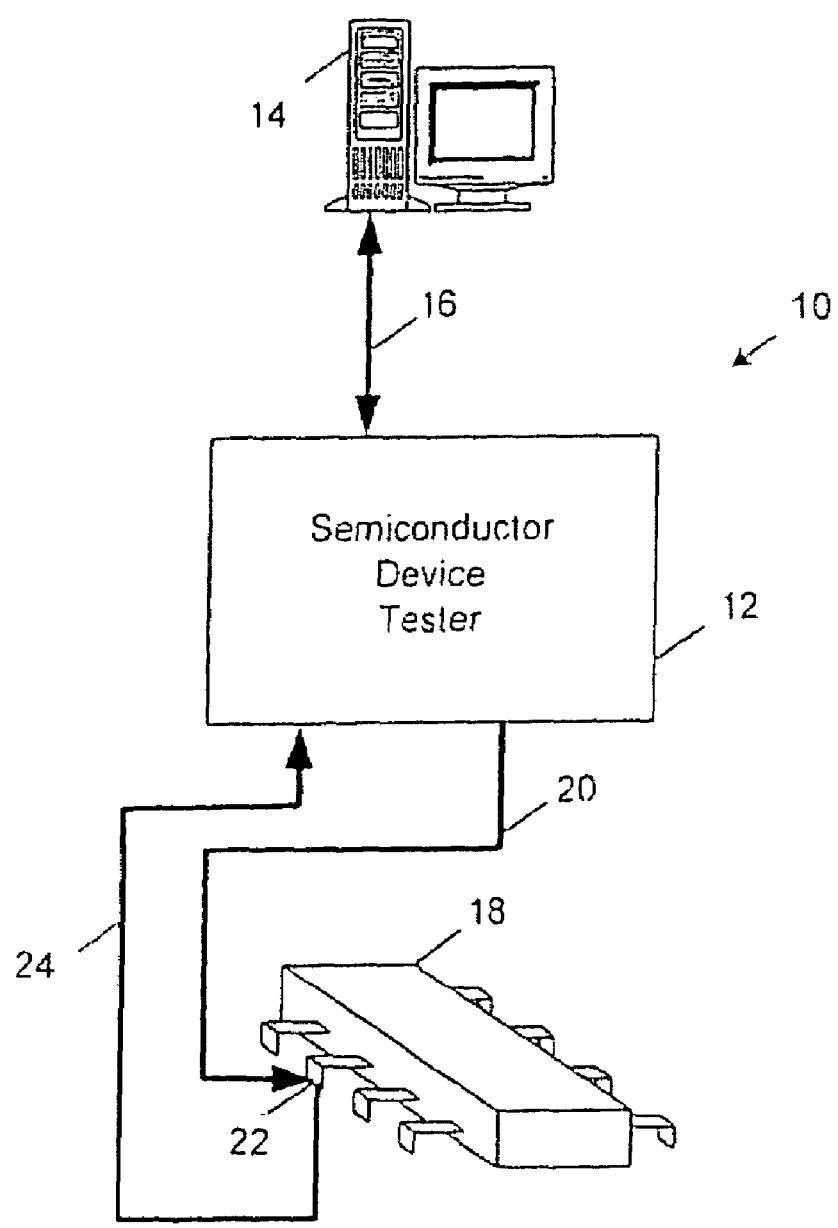
FIG. 1 is a diagrammatic view of a system for testing semiconductor devices.

Referring to FIG. 1, a system 10 for testing semiconductor devices includes a semiconductor device tester 12, such as an ATE or other similar testing device. To control semiconductor device tester 12, system 10 includes a computer system 14 that interfaces with tester 12 over a hardwire connection 16. Typically, computer system 14 provides commands to tester 12 that initiate the execution of routines and functions for testing a semiconductor device. Such executing test routines may initiate the generation and transmission of test signals to the DUT and the collection of responses from the DUT. Various types of semiconductor devices may be tested by system 10. In this example, the DUT is an integrated circuit (IC) chip 18 (e.g., a memory chip, a microprocessor, an analog-to-digital converter, a digital-to-analog converter, etc.).

To provide test signals and collect responses from the DUT, semiconductor device tester 12 is connected to one or more connector pins that provide an interface for the internal circuitry of IC chip 18. To test some DUTs, as many as sixty-four or one hundred twenty-eight connector pins may be interfaced to tester 12. For illustrative purposes, in this example semiconductor device tester 12 is connected to one connector pin of IC chip 18 via two hardwire connections. One conductor 20 (e.g., cable) is connected to a pin 22 and is used to deliver test signals (e.g., PMU test signals, PE test signals, etc.) to the internal circuitry of IC chip 18. Another conductor 24 is also connected between pin 22 and semiconductor device tester 12. In this arrangement, conductor 24 is used to sense the test signal present at pin 22 and feedback the signal to semiconductor device tester 12. By providing this feedback signal, losses such as voltage drops in conductor 20 may be determined and compensated for by tester 12. Also, if the internal circuitry of IC chip 18 draws current from the test signal present at pin 22, tester 12 is alerted by the feedback signal and may compensate for the voltage drop due to the current.

Along with delivering test signals and providing feedback, a conductor may connect a pin to semiconductor device tester 12 for collecting one or more responses from the DUT. For example gain response, phase response, or other types of two port tests may be performed by collecting a response from one or more pins included in IC chip 18. Single port tests may also be performed by collecting a response from one or more pins of IC chip 18. For example, tester 12 may provide a test signal to pin 22 and collect any portion of the signal reflected back over conductor 20 (which also delivered the test signal). By collecting the reflected signal portion, the input impedance of pin 22 may be characterized along with other single port testing quantities. Tester 12 may also generate and inject digital signals that contain test vectors into one or more pins of IC chip 18 to perform other types of tests such as quantifying the storage performance of IC chip 18.

Figure 2:
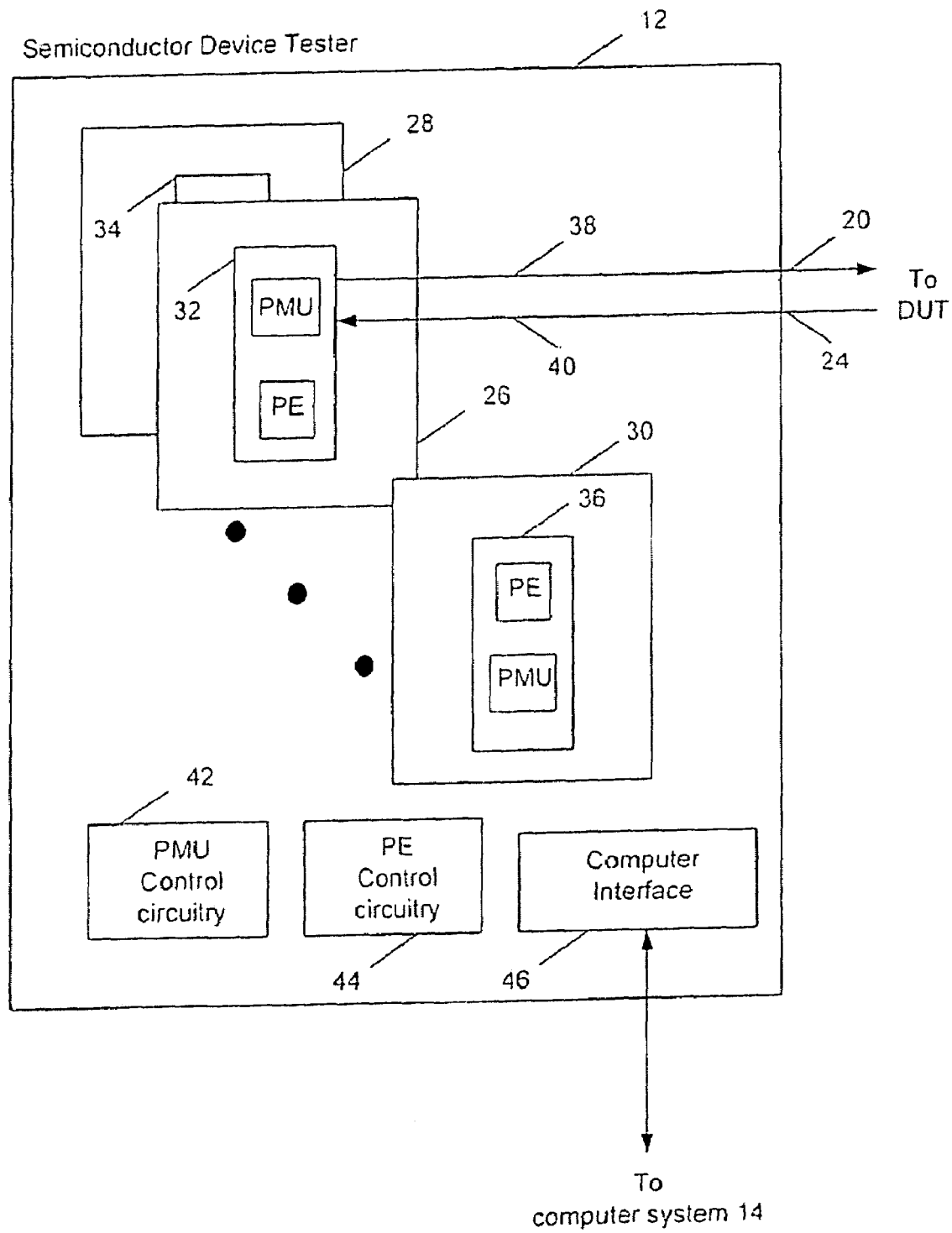
FIG. 2 is a diagrammatic view of a semiconductor device tester included in the system shown in FIG. 1.

Referring also to FIG. 2, to send and collect test signals from multiple connector pins of a DUT (or multiple DUTs), semiconductor device tester 12 includes an interface card 26 that is capable of communicating with numerous pins. For example, interface card 26 may initiate transmitting test signals to, e.g., thirty-two, sixty-four, or one hundred twenty-eight pins and collecting the corresponding responses. Each communication link to a pin is typically referred to as a channel and by providing a large number of channels, testing time is reduced. Along with having many channels on an interface card, by including multiple interface cards in tester 12, the overall number of channels increases thereby further reducing testing time. In this example, two additional interface cards 28 and 30 are shown to demonstrate that multiple interface cards may populate tester 12.

Each interface card includes a dedicated integrated circuit (IC) chip (e.g., an application specific integrated circuit (ASIC)) for performing particular test functions. For example, interface card 26 includes IC chip 32 for performing PMU and PE tests. Additionally interface cards 28 and 30 respectively include IC chips 34 and 36 that provide PMU and PE testing. Typically PMU testing involves providing a DC voltage or current signal to the DUT to determine such quantities as input and output impedance, current leakage, and other types of DC performance characterizations. PE testing involves sending AC test signals and waveforms to a DUT (e.g., IC chip 18) and collecting responses to further characterize the performance of the DUT. For example, IC chip 32 may initiate transmitting (to the DUT) AC test signals that represent a vector of binary values for storing on the DUT. Once stored, the DUT is accessed by tester 12 to determine if the correct binary values have been stored. Since digital signals typically include abrupt voltage transitions, the PE circuitry on IC chip 32 operates at a relatively high speed in comparison to the PMU circuitry on IC chip 32.

To pass both DC and AC test signals and waveforms from interface card 26 to DUT 18, a pair of conducting traces 38, 40 connect IC chip 32 to respective conductors 20 and 24. In some arrangements an interface device may be used to connect conductors 20 and 24 to the DUT. For example, the DUT (e.g., IC chip 18) may be mounted onto a device interface board (DIB) such that each DUT pin is easily accessible. In such an arrangement, conductors 20 and 24 may respectively connect to the DIB for placing test signals on the appropriate pin(s) of the DUT.

In this example only two conductors 38, 40 respectively connect IC chip 32 to conductors 20 and 24 for delivering and collecting signals. However, IC chip 32 (along with IC chips 34 and 36) typically has multiple pins (e.g., eight, sixteen, etc.) that are respectively connected with multiple conductors to the DIB. Additionally, in some arrangements, tester 12 may connect to two or more DIB's in order to interface the channels provided by interface cards 26, 28, and 30 to one or multiple devices under test.

To initiate and control the testing performed by interface cards 26, 28, and 30, tester 12 includes PMU control circuitry 42 and PE control circuitry 44 that provide test parameters (e.g., test signal voltage level, test signal current level, digital values, etc.) for producing test signals and analyzing DUT responses. Tester 12 also includes a computer interface 46 that allows computer system 14 to control the operations executed by tester 12 and also allows data (e.g., test parameters, DUT responses, etc.) passing between tester 12 and computer system 14.

Figure 3:
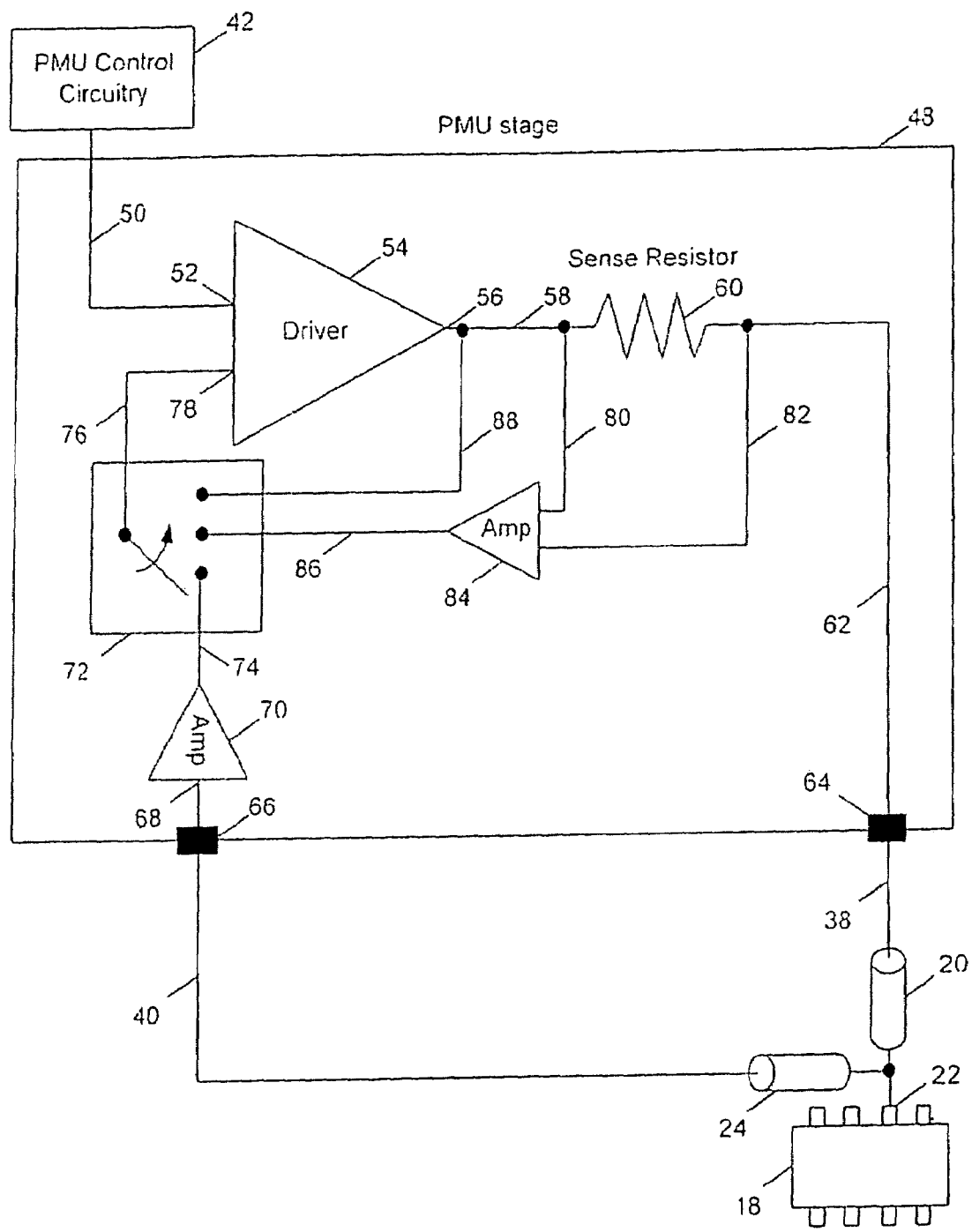
FIG. 3 is a diagrammatic view of PMU stage that includes a feedback circuit for reducing PMU testing time.

Referring to FIG. 3, a portion of IC chip 32 is shown that includes a PMU stage 48 for performing PMU testing. To initiate sending a PMU test signal to DUT 18, PMU control circuitry 42 sends a DC signal over conducting trace 50 to an input 52 of a driver circuit 54 that conditions (e.g., amplifies) the signal and sends it to an output 56. For example, PMU control circuitry 42 may provide a 3-volt DC signal to input 52. Using this input signal, driver circuit 54 may apply a unity gain and provide a 3-volt DC signal at the high-impedance output 56. To send the 3-volt DC signal to IC chip 18 for PMU testing, a conductor 58 is connected to output 56. Conductor 58 is connected to a sense resistor 60 that is used to monitor PMU test signals sent to the DUT. Sense resistor 60 is also connected to a conductor 62 that provides the 3-volt DC test signal to an interface connector 64 that allows the test signal to exit IC chip 32. In this example, interface connector 64 is connected to conductor 38 that provides the PMU test signal to pin 22 of IC chip 18 via conductor 20.

In this example, a 3-volt DC signal is provided by semiconductor device tester 12 to pin 22 for performing PMU testing. However, if IC chip 18 draws current from this signal, voltage drops are produced by impedances that are present between driver circuit 54 and IC chip 18. For example, if current flows into pin 22, a voltage drop is produced across sense resistor 60. Additionally, resistance present in interface connector 62 and/or conductors 62, 38, and 20 may produce voltage drops due to this current flow. Due to these voltage drops, the level of the 3-volt DC signal at pin 22 reduces compared to the test signal provided by PMU control circuitry 42 to input 52 of driver circuit 54. For example, due to current drawn by IC chip 18, the DC signal at pin 22 may be substantially less (e.g., 1-volt) than the 3-volt DC signal present at input 52 of driver circuit 54.

To compensate for voltage drops experienced between driver circuit 54 and IC chip 18 (or another DUT), semiconductor device tester 12 includes circuitry for detecting signal loss and for appropriately adjusting the output of driver circuit 54. For example, if the test signal at pin 22 has reduced to a 2-volt signal, tester 12 detects this 1-volt signal loss and adjusts the output of driver circuit 54 so that the desired 3-volt signal is delivered to IC chip 18. To detect this signal loss at the DUT, one conventional technique monitors the test signal present at the DUT and adjusts the output of driver circuit 54 to compensate for the detected signal loss. In this example, to monitor the PMU test signal provided to IC chip 18, conductor 24 is connected to pin 22. By monitoring the test signal present at pin 22, a feedback signal may be sent to driver circuit 54 for adjusting its output. In particular, the feedback signal is passed from conductor 24 to conductor 40 that is connected to an interface connector 66. Interface connector 66 provides the feedback signal to the internal circuitry of IC chip 32. In this example, the feedback signal is passed to an input 68 of a buffer amplifier 70 (e.g., a unity gain amplifier) so that minimal current is drawn through conductors 24 and 40 and interface connector 66. While buffer amplifier 70 is incorporated into IC chip 32, in other arrangements buffer amplifier 70 may be located external to IC chip 32. For example, buffer amplifier 70 may be located on interface card 26 or near to the DUT.

Buffer amplifier 70 passes the feedback signal through a conductor 74 to a switch 72 that controls from which source feedback is provided to driver circuit 54. Typically tester 12 or computer system 14 controls which position switch 72 is placed. If switch 72 is placed into a position that connects conductor 74 and a conductor 76, the feedback signal from pin 22 is provided to an input 78 of the driver circuit 54. By providing this feedback signal, driver circuit 54 can determine the difference between the feedback signal and the test signal provided by PMU control circuitry 42 (at input 52). For example, if the feedback signal is a 2-volt DC signal and the signal from PMU control circuitry 42 is a 3-volt DC signal, driver circuit 54 compares the signals to determine that 1-volt is loss during transmission to pin 22. To compensate for this loss, driver circuit 54 may adjust its output so that a 4-volt DC signal is provided from output 56. Correspondingly, due to the losses between driver circuit 54 and the DUT, the 4-volt signal is reduced to a 3-volt DC signal at pin 22. So, by monitoring the signal present at pin 22 and appropriately adjusting the output of driver circuit 54, the desired test signal is provided to the DUT.

Another conventional technique to monitor the PMU test signal being provided to the DUT is to monitor the current being drawn by the DUT. By monitoring this current flow, the output of driver circuit 54 may be adjusted to compensate for voltage drops due to this drawn current. To provide this monitoring technique, a pair of conductors 80, 82 is connected across sense resistor 60 to detect the voltage across the resistor. Thereby, if pin 22 draws current through conductors 20, 38, and 62, voltage is detected across sense resistor 60. Conductors 80 and 82 provide this voltage drop present across sense resistor 60 to a buffer amplifier 84 that provides a DC signal representing the voltage drop across sense resistor 60. A conductor 86 passes the DC signal from the output of buffer amplifier 84 to switch 72. If switch 72 is closed (by tester 12 or computer system 14) to connect conductor 86 and conductor 76, the DC signal from buffer amplifier 84 is provided to input 78 of driver circuit 54. Similar to the DC signal that may be present on conductor 74 (from pin 22), the feedback signal present on conductor 86 is used by driver circuit 54 for adjusting its output to compensate for the current being drawn by the DUT.

By monitoring PMU test signals with a feedback signal that is detected at sense resistor 60 or the DUT (e.g., pin 22), driver circuit 54 can accurately adjust for signal losses between the driver circuit and the DUT. However, these both of these feedback signals are sent across considerable distances prior to being received by switch 72. For example, the DC voltage signal detected at pin 22 is sent over conductors 24, 40, and 74, along with being passed through interface connector 66 and buffer amplifier 70. To monitor the voltage across sense resistor 60, the feedback DC voltage signal is passed through conductors 80, 82, and 86, along with being passed through buffer amplifier 84. These transmission distances cause a time delay for adjusting the output of driver circuit 54 for an appropriate test signal. Correspondingly, due to this time delay, additional time is needed for performing a PMU test. Furthermore as more devices are tested, considerable testing time is lost.

To reduce the time for driver circuit 54 to provide an appropriate DC test signal, PMU stage 48 includes a feedback circuit to monitor signals at output 56 of driver circuit 54 and provides a feedback signal to switch 72. By monitoring the signals at output 56, the time needed to provide a feedback signal to driver circuit 54 is significantly reduced. By reducing the time to provide a feedback signal, driver circuit 54 relatively quickly adjusts its output for current drawn by the DUT. In this example, the feedback circuit is provided by a conductor 88 that is connected to output 56 of driver circuit 54 and to switch 72. When switch 72 is closed (thus connecting conductor 88 to conductor 76), the signal present at output 56 is provided to input 78 of driver circuit 54. Accordingly, if the DC test signal present at output 56 is reduced (e.g., a 2-volt DC signal) due to current drawn by IC chip 18, driver circuit 54 can relatively quickly adjust the output signal so that the desired test signal (e.g., a 3-volt DC signal) is received at pin 22.

In this example, conductor 88 provides a feedback signal from output 56 to switch 72, however in other arrangements other circuitry may be implemented to provide the feedback circuitry. For example, a buffer amplifier may be connected along conductor 88 to reduce current being drawn by the conductor. Also, conductor 88 may be directly connected from output 56 to input 78. By removing switch 72, propagation delays are further reduced. However, the inclusion of switch 72 and the circuitry for monitoring voltage signals across sense resistor 60 and/or at pin 22 allows for accurate feedback signals to be detected at (or near) the DUT. However, monitoring the PMU test signals at sense resistor 60 and pin 22 increases the time needed for driver circuit 54 to adjusts the driver circuit output along with increasing the overall PMU testing time.

Figure 4:
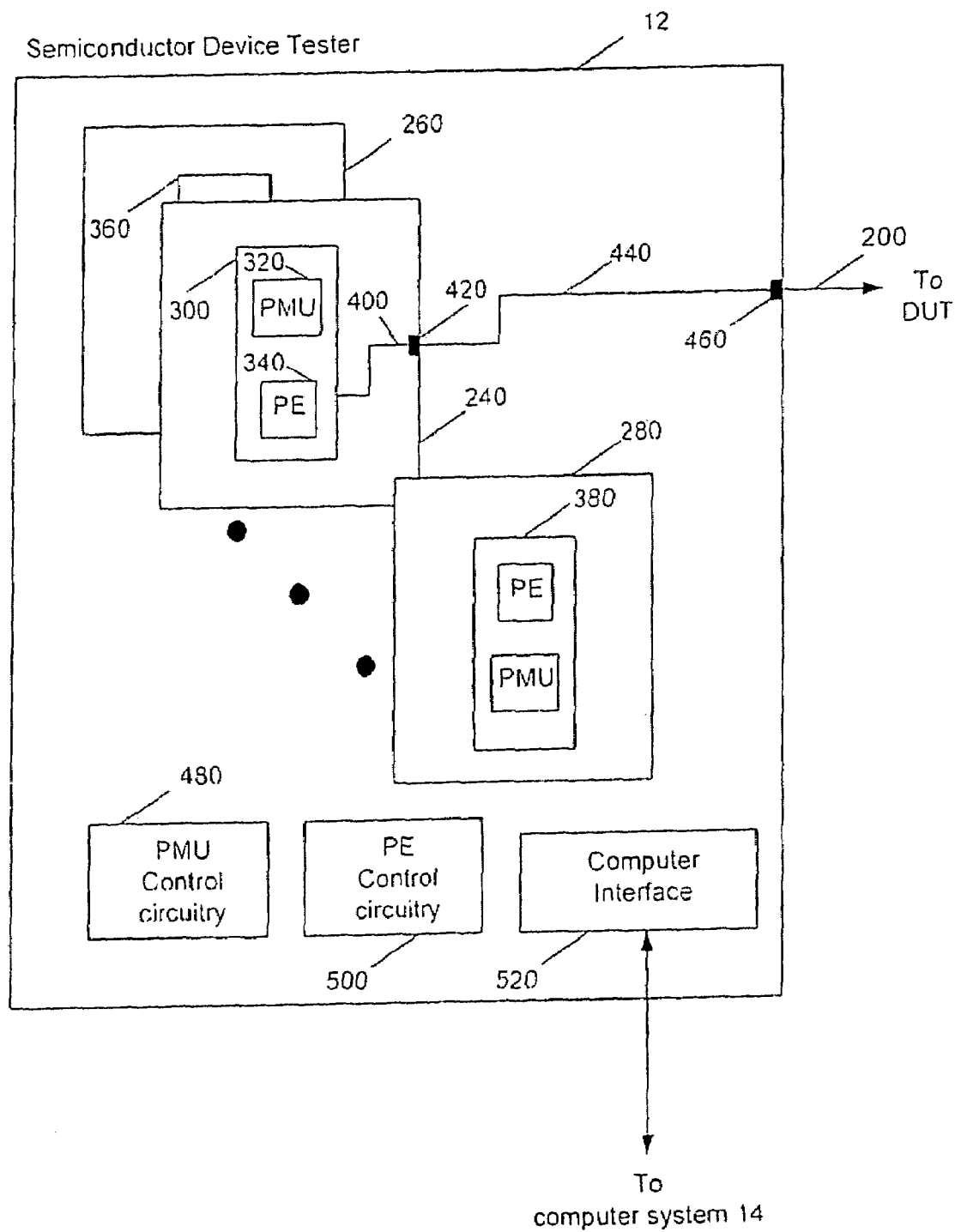
FIG. 4 is a diagrammatic view of another embodiment of the semiconductor device tester included in the system shown in FIG. 1.

Referring also to FIG. 4, in some embodiments semiconductor device tester 12 includes an interface card 240 that can communicate with numerous pins of a DUT (or multiple DUTs). For example, interface card 240 may transmit test signals to, e.g., thirty-two, sixty-four, or one hundred twenty-eight pins and collect the corresponding responses. Each communication link to a pin is typically referred to as a channel and by providing test signals to a large number of channels, testing time is reduced since multiple tests may be simultaneously performed. Along with having many channels on an interface card, by including multiple interface cards in tester 12, the overall number of channels increases, thereby further reducing testing time. In this example, two additional interface cards 260 and 280 are shown to demonstrate that multiple interface cards may populate tester 12.

Each interface card includes a dedicated integrated circuit (IC) chip (e.g., an application specific integrated circuit (ASIC)) for performing particular test functions. For example, interface card 240 includes IC chip 300 for performing parametric measurement unit (PMU) tests and Pin electronics (PE) tests. IC chip 300 respectively has a PMU stage 320 that includes circuitry for performing PMU tests and a PE stage 340 that includes circuitry for performing PE tests. Additionally interface cards 260 and 280 respectively include IC chips 360 and 380 that include PMU and PE circuitry. Typically PMU testing involves providing a DC voltage or current signal to the DUT to determine such quantities as input and output impedance, current leakage, and other types of DC performance characterizations. PE testing involves sending AC test signals and waveforms to a DUT (e.g., IC chip 18) and collecting responses to further characterize the performance of the DUT. For example, IC chip 300 may transmit (to the DUT) AC test signals that represent a vector of binary values for storing on the DUT. Once stored, the DUT is accessed by tester 12 to determine if the correct binary values have been stored. Since digital signals typically include abrupt voltage transitions, the circuitry in PE stage 340 on IC chip 300 operates at a relatively high speed in comparison to the circuitry in PMU stage 320.

To pass both DC and AC test signals and waveforms from interface card 240 to DUT 18, a conducting trace 400 connects IC chip 300 to an interface board connector 420 that allows signals to be passed on and off interface board 240. Interface board connector 420 is also connected to a conductor 440 that is connected to an interface connector 46 that allows signals to be passed to and from tester 12. In this example conductor 200 is connected to interface connector 460 for bi-directional signal passing between tester 12 and pin 22 of IC chip 18. In some arrangements an interface device may be used to connect one or more conductors from tester 12 to the DUT. For example, the DUT (e.g., IC chip 18) may be mounted onto a device interface board (DIB) for providing easy access to each DUT pin. In such an arrangement, conductor 200 may be connected to the DIB for placing test signals on the appropriate pin(s) (e.g., pin 22) of the DUT.

In this example only conducting trace 400 and conductor 440 respectively connect IC chip 300 and interface board 240 for delivering and collecting signals. However, IC chip 300 (along with IC chips 360 and 380) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 240, 260, and 280 to one or multiple devices under test.

To initiate and control the testing performed by interface cards 240, 260, and 280, tester 12 includes PMU control circuitry 480 and PE control circuitry 500 that provide test parameters (e.g., test signal voltage level, test signal current level, digital values, etc.) for producing test signals and analyzing DUT responses. Tester 12 also includes a computer interface 520 that allows computer system 14 to control the operations executed by tester 12 and also allows data (e.g., test parameters, DUT responses, etc.) passing between tester 12 and computer system 14.

As mentioned, PMU testing typically involves sending DC test signals to the DUT and collecting response signals. For example, test signals may be sent to provide a particular DC current or DC voltage to the DUT. Typically, when these test signals are produced with circuitry in PMU stage 320, the desired current and voltage levels are not instantaneously achieved and time is needed for these signals to settle at their predefined levels. Due to this signal settling period, additional time is needed to perform a PMU test. Multiplying this delay time by the number of PMU tests being performed on a DUT (or a group of DUTs), significant testing time is lost. This lost testing time correspondingly reduces manufacturing efficiency and increases manufacturing costs.

Figure 5:
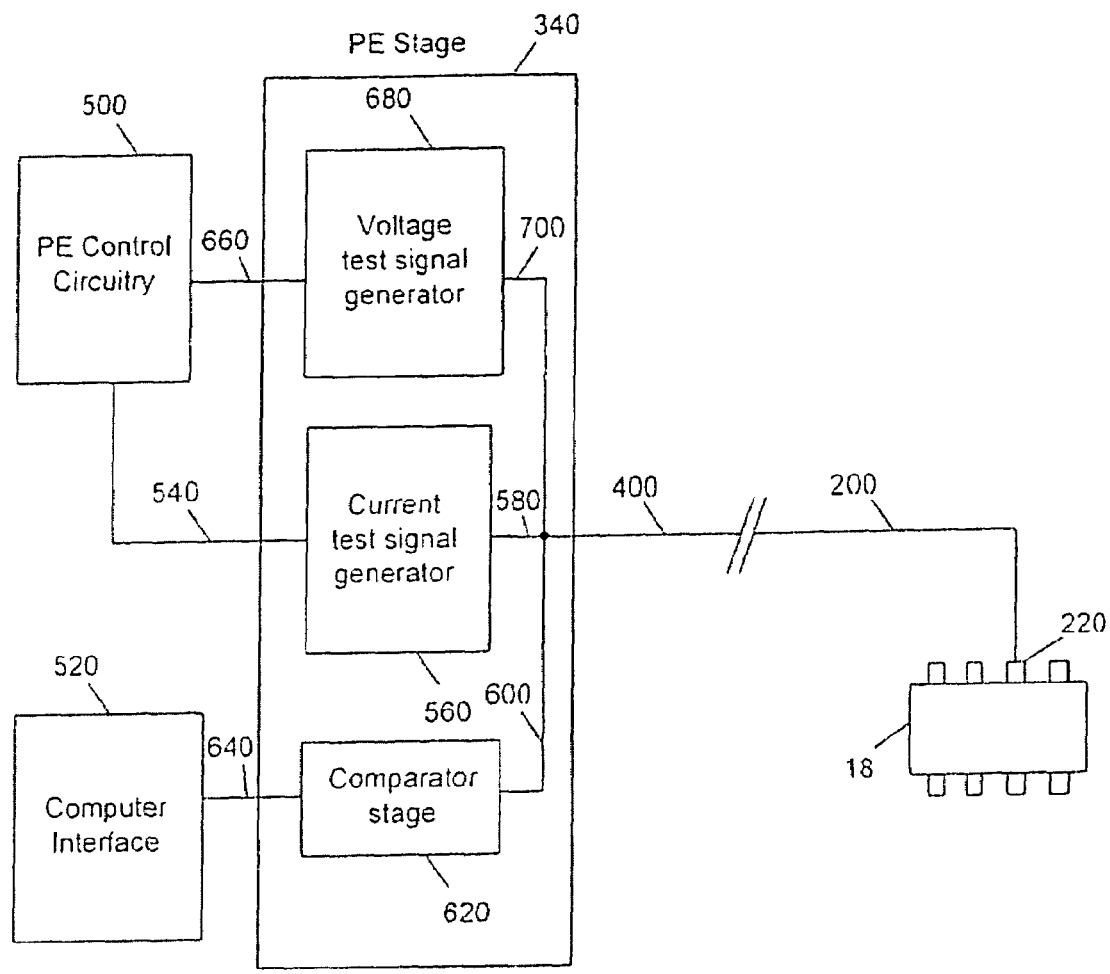
FIG. 5 is a diagrammatic view of PE stage configured to provide PMU test signals from the tester shown in FIG. 4.

Referring also to FIG. 5, to reduce PMU testing time, the relatively high-speed PE stage 340 is used to perform some PMU tests by producing PMU test signals. By producing PMU test signals with PE stage 340, signal settling time decreases along with testing time. Additionally, PE stage 340 is used to collect response signals from the DUT(s) being provided the PMU test signals. In particular, PE stage 340 is used to produce PMU test signals that provide a particular current signal to the DUT. Along with providing the PMU test signal, PE stage 340 also senses a voltage at the DUT that is produced in response to the current test signal. By using the high-speed circuitry of PE stage 340 (compared to PMU stage 320), PMU test signals are produced relatively quickly and testing time is reduced. By reducing testing time, time is conserved and may be used for testing additional DUTs and thereby improve manufacturing efficiency.

To initiate a PMU test with PE stage 340, PE control circuitry 500 sends a control signal over conductor 540 to a current test signal generator 560 that is included in PE stage 340. Typically current test signal generator 560 uses the control signal for setting the current level of an output signal that is sent to the DUT. For example, the control signal may direct current test signal generator 560 to output a fifty milliamp DC current signal over conductor 580 for delivery to pin 220 of IC chip 18 (via conducting trace 400 and conductors 440 and 200).

Along with sending DC test current signals, PE stage 34 also collects response signals from the DUT after injecting the PMU test signal. For example, after providing a DC current test signal, a voltage signal may be sensed at pin 220 and sent to PE stage 34 over the same conductors (i.e., conductors 200 and 440, and conducting trace 400) that provided the current signal to the DUT. Upon receiving the voltage signal, a conductor 600 provides the signal to a comparator stage 620 included in PE stage 340. By comparing the voltage signals to predefined voltages, comparator stage 620 is capable of determining the DC voltage level of the response signal sensed at the DUT. Upon determining the level of the DC voltage signal sensed at the DUT, comparator stage 620 passes representative data over a conductor 640 to computer interface 520 that passes the data to a computer system (e.g., computer system 14) or another type of digital device (e.g., a personal digital assistant (PDA), a cellular telephone, etc.) or a network (e.g., the Internet).

While PE stage 340 provides PMU test signals for reducing PMU testing times, the stage also provides PE testing functions. For example, PE control circuitry 500 may send a control signal over a conductor 660 to a voltage test signal generator 680 that is included in PE stage 340. Voltage test signal generator 680 produces PE test signals such as AC waveforms that are sent over a conductor 700 (along with conducting trace 400 and conductors 440 and 200) to the DUT. Similar to providing PMU test signals, the DUT may produce signals in response to the PE test signals. Some of these response signals may be received by PE stage 340 via conductors 200, 440, and conducting trace 400. Upon receiving the signals, they may be sent over conductor 600 to comparator stage 620 for analysis. For example, an AC signal may be received by PE stage 340 in response to an AC signal sent from voltage test signal generator 680. Arriving at comparator stage 620, this AC response signal may be compared to a predefined voltage level determine if the signal is above or below the voltage. Once determined, data representing the comparison may be sent over conductor 640 to computer interface 520 for further analysis by a computer system such as computer system 14.

Figure 6:
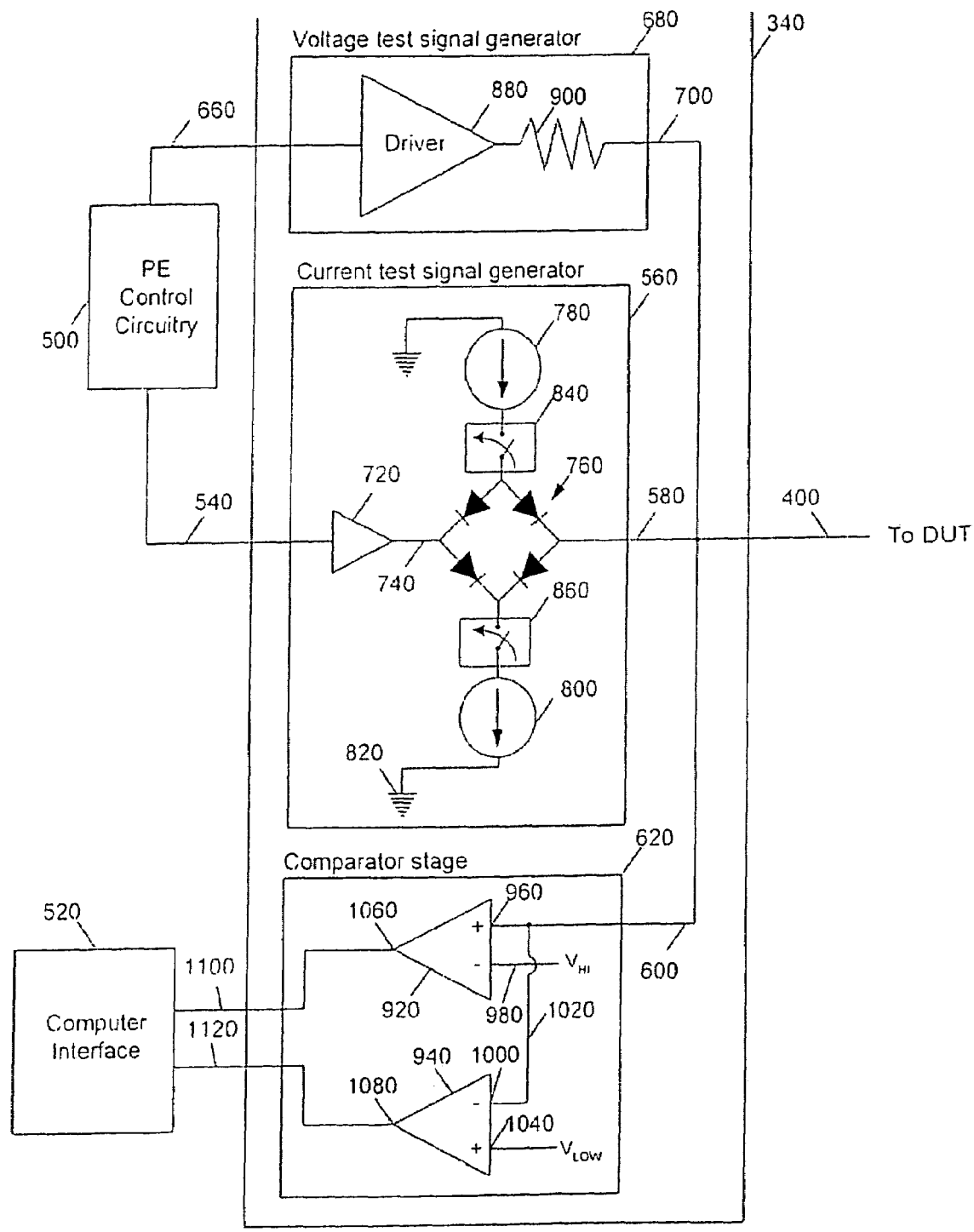
FIG. 6 is an exemplary circuit diagram of the PE stage shown in FIG. 5.

Referring also to FIG. 6, exemplary circuitry for PE stage 340 is presented that includes voltage test signal generator 680, current test signal generator 560, and comparator stage 620. Along with providing PE test signals to a DUT, PE stage 340 provides PMU test signals to reduce PMU testing time. In particular, current test signal generator 560 is used to produce PMU current test signals that are sent to the DUT (e.g., IC chip 18) over conductor 580 and conducting trace 400. In response to receiving a DC current test signal, a voltage response signal is produced by the DUT. For example, by forcing a current test signal into pin 220, a voltage signal may be produced at pin 220 due to the input impedance of the DUT. This voltage signal at pin 220 is provided to PE stage 340 via conductors 200, 440, and conducting trace 400. When a signal is provided by the DUT, current test signal generator 560 and voltage test signal generator 680 are placed in a high output impedance mode. Due to the high output impedance mode, the voltage signal is provided over conductor 600 to comparator stage 620 and is not received by current test signal generator 560 and voltage test signal generator 680. Comparator stage 620 determines the level of the voltage signal from the DUT and provides a signal to computer interface 520 that identifies this voltage level. As mentioned, the circuitry used for PE testing operates at relatively high speeds to provide e.g., digital test signals to the DUT and to collect corresponding response signals from the DUT. By using this high speed circuitry of PE stage 340 for PMU testing, PMU tests are executed faster and testing time is conserved additional operations such as more PMU and PE tests.

To provide current test signals, PE control circuitry 500 sends a signal over conductor 540 to current test signal generator 560. In this example, conductor 540 provides the signal from PE control circuitry to an amplifier 720 that conditions (e.g., amplifies) the signal and sends it over a conductor 740 to a diode bridge 760. The signal received by diode bridge 760 is used to bias the diodes included in the bridge and control the current signal provided by generator 560. By biasing diode bridge 760, current may flow from a current source 780 to conductor 580 or current may flow from conductor 580 to a second current source 800 that is connected to a ground terminal 820. Since generator 560 provides bi-directional current flows by using current source 780 and current source 800, PE control circuitry 500 can modulate the current signal sent to the DUT by controlling the bias of diode bridge 760. By providing modulated current signals, tester 12 may provide a variety of AC signals to the DUT for PE testing. Current test signal generator 560 also includes two switches 840 and 860 that respectively control current flow from current source 780 or to current source 800. For examples if switch 840 is closed, current source 780 is connected to diode bridge 760 and may send a current signal to the DUT via conductor 580. Similarly, if switch 860 is closed, current source 800 is connected to diode bridge 760 and may draw current through conductor 580. If switch 840 or 860 is open, the corresponding current source 780 or 800 is isolated from diode bridge 760.

To provide a voltage test signal to the DUT for PE tests, PE control circuitry 500 sends a test signal (e.g., AC signal, digital signal, etc.) to voltage test signal generator 680 over conductor 660. Conductor 660 provides the signal to a driver (e.g., amplifier circuit) that conditions (e.g., amplifies) the signal and sends a voltage test signal to a resistor 900. The resistance of resistor 900 is selected for impedance matching. To deliver the voltage test signal to the DUT, resistor 900 is connected to conductor 700 that connects to conducting trace 400.

To provide a DC current signals for PMU testing, in one scenario, PE control circuitry 500 provides a signal to amplifier 720 for biasing diode bridge 760. The signal from amplifier 720 biases diode bridge 760 such that current passes through the bridge substantially un-modulated (to produce a DC current signal). In one example, switch 840 is closed and current source 780 provides current to diode bridge 760. Since the current is not modulated, a substantially DC current signal is sent over conductor 580 to conducting trace 400 for delivery to the DUT (e.g., IC chip 18). In other test scenarios, current source 800, or a combination of current sources 780 and 800 may provide a DC current test signal to the DUT.

Upon receiving the DC current test signal from signal generator 560, a voltage signal is produced at the DUT (e.g., pin 220 of IC chip 18). This voltage signal is provided from the DUT to conducting trace 400 (via conductors 200 and 440). Since the output impedance of the voltage test signal generator 680 and the current test signal generator 560 is relatively large, these stages are isolated and the voltage signal is provided to comparator stage 620 for analysis. For one analysis, the voltage signal is compared to one voltage level (i.e., $V_{HI}$) and a lower voltage level (i.e., $V_{LOW}$). By performing the comparison, comparator stage 620 may determine if the voltage signal on conductor 600 is greater than $V_{HI}$, less than $V_{LOW}$, or is between $V_{HI}$ and $V_{LOW}$. By assigning voltages to $V_{HI}$ and $V_{LOW}$ that are slightly different, the value of the voltage signal may be approximately determined. For example, $V_{LOW}$ may be set to 0.65 volt and $V_{HI}$ may be set to 0.75 volt. If comparator stage 620 determines that the voltage signal from the DUT is between $V_{HI}$ and $V_{LOW}$, a voltage level of 0.7 volt may be used to approximately characterize the voltage signal. If comparator stage 620 determines that the voltage signal is less than $V_{LOW}$ or greater than $V_{HI}$, new voltages may be assigned to $V_{LOW}$ and $V_{HI}$. For example, $V_{LOW}$ and $V_{HI}$ may be increased or decreased by the same amount to retain the detection window width. Alternatively $V_{LOW}$ and $V_{HI}$ may adjusted to widen or narrow the detection window. These adjusted voltages for $V_{LOW}$ and $V_{HI}$ may then be compared to voltage signal to approximate the voltage level of the signal. In some arrangements, adjustments to $V_{LOW}$ and $V_{HI}$ and comparing the voltages is executed in an iterative fashion to approximate the voltage signal from the DUT.

In this example, comparator stage 620 includes two operational amplifiers 920, 940 for approximating the voltage of the voltage signal on conductor 600 from the DUT. Operational amplifier 920 is provided the voltage signal on a non-inverting input 960 and $V_{HI}$ on an inverting input 980. Similarly operational amplifier 940 is provided the voltage signal on an inverting input 1000 (over a conductor 1020) and $V_{LOW}$ on a non-inverting input 1040. Operational amplifier 920 provides a signal at an output 1060 that identifies if the voltage signal is greater than or less than $V_{HI}$. Similarly operational amplifier 940 provides a signal at an output 1080 that identifies if the voltage signal is greater than or less than $V_{LOW}$. In this example, both of these signals are sent to computer interface 520 over respective conductors 1100 and 1120. By providing these signals to computer interface 520, data representing the comparison performed by comparator stage 620 may be provided to other portions of tester 12 and computer system 14. Based on this data, the voltage signal from the DUT may be approximated if the voltage is between $V_{LOW}$ and $V_{HI}$. If the signal voltage is greater than $V_{HI}$ or less than $V_{LOW}$, computer system 14 or tester 12 may initiate adjustments to $V_{LOW}$ and/or $V_{HI}$ and execute another comparison of the voltage signal. However, since PE stage 340 operates at higher speeds compared to a PMU stage, by performing PMU testing with PE stage 340 testing efficiency increases and testing time is reduced.

Figure 7:
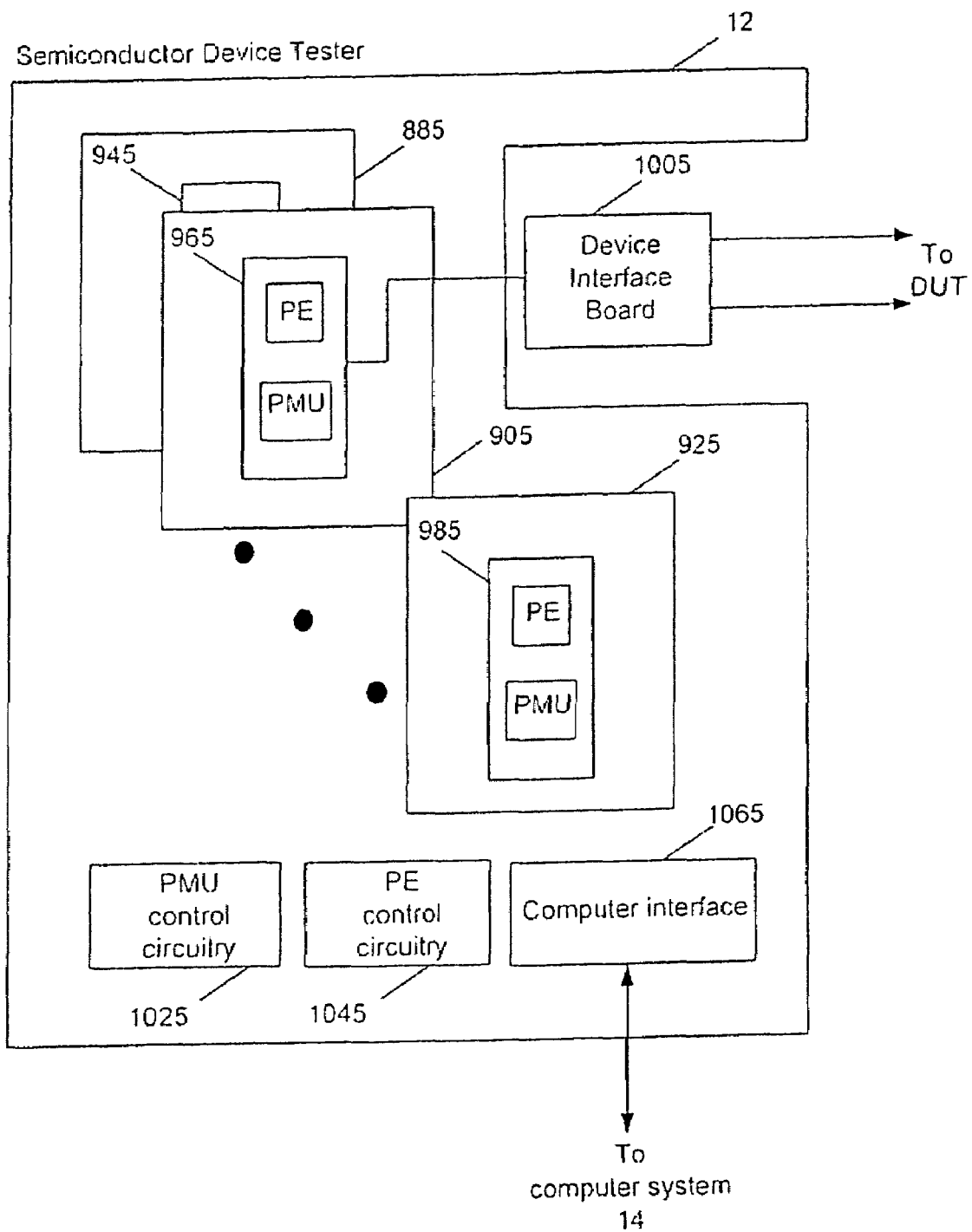
FIG. 7 is a diagrammatic view of a semiconductor device tester with PE and PMU circuitry incorporated into the same integrated circuit chips.

Referring also to FIG. 7, to reduce the occupied space on each interface card and reduce output stage redundancy, PE circuitry and PMU circuitry are incorporated in the same IC chip. Additionally, both the PE circuitry and PMU circuitry share a common output stage to reduce circuitry in each IC chip providing both PE and PMU functions. For illustrative purposes, some embodiments of semiconductor tester 12 include a series of interface cards 885, 905, and 925 that respectively have mounted IC chips that provide PE and PMU functions for testing of a DUT (e.g., a memory chip, a microprocessor, an analog-to-digital converter, etc.). In particular, respective IC chips 945, 965, and 985 include circuitry to provide PE and PMU test signals. By combining the PE and PMU functions on the same IC chips, the number of chips on each interface card is reduced and space on each card is conserved. This conserved space may be used, e.g., to implement additional functionality or to add more test channels to the interface cards. Furthermore, by sharing a common output stage between the PE and PMU circuitry on each IC chip, chip area previously used for redundant output stages and impedance-matching resistors is conserved. Tester 12 is connected to a device interface board 1005 for directing test signal to appropriate pins of the DUT. Additionally, tester 12 includes PMU control circuitry 1025, PE control circuitry 1045, and a computer interface 1065 for passing commands and data between tester 12 and a computer system (e.g., computer system 14).

Figure 8:
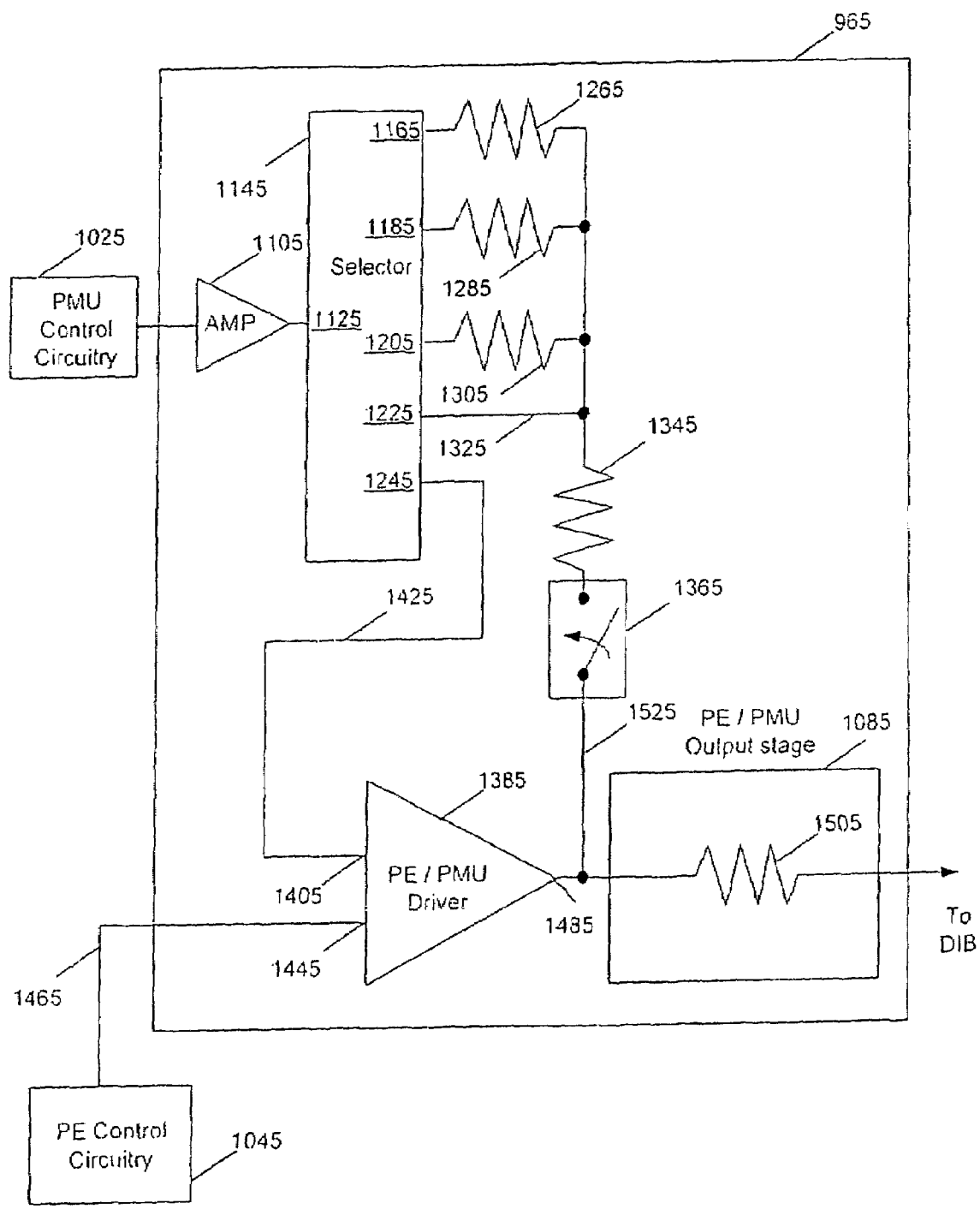
FIG. 8 is a diagrammatic view of PE and PMU circuitry that share a common output stage.

Referring also to FIG. 8, a portion of IC chip 965 is presented that includes circuitry for providing both PE and PMU test signals to a DUT. Additionally, IC chip 965 includes an output stage 1085 that is shared by both the PE and PMU circuitry. By sharing common output stage 1085, chip space is conserved on IC chip 965. Additionally, by implementing both functions in the same IC chip, board space is conserved on interface card 905.

PMU control circuitry 1025 sends a DC test signal through an amplifier 1105 to an input 1125 of a selector 1145 that directs the signal to a particular output port. In this example, selector 1125 includes five output ports 1165, 1185, 1205, 1225, and 1245. Each output port is used for providing a DC test signal with a particular current level (e.g., 50 milliamp, 2 milliamp, 200 microamp, 20 microamp, 2 microamp, etc.) to the DUT. Sense resistors 1265, 1285, and 1305 have different resistance values for sensing the particular DC test signal propagating from the corresponding output port. Output port 1225 is connected conducting trace 1325 (that does not include a sense resistor) for passing a DC test signal. In other arrangements, other types of resistors or resistor networks may be connected to the output ports 1165, 1185, 1205, 1225, and 1245 of selector 1145. For example a resistor may be inserted in series with conductor 1325.

Test signals from output ports 1165, 1185, 1205, and 1225 are passed through a resistor 1345 to a switch 1365 that controls passage of the test signals to shared output stage 1085. Switch 1365 may be controlled by tester 12 or by commands sent from a computer system such as computer system 14. Typically when a PMU test is executed, switch 1365 is closed. However, when a PMU signal (e.g., 50 milliamp) is provided from output port 1245 switch 1365 is open. Additionally, for executing a PE test, switch 1365 is open. To control the position of switch 1365, tester 12 may produce a voltage or current signal to initiate placing switch 1365 into an open or closed position. Switch 1365 may be incorporated into IC chip 965 by various techniques known in the art of semiconductor device development and production. For example, one or more transistors or other types of semiconductor components may be incorporated into IC chip 965 to produce switch 1365.

To provide a relatively high-current PMU test signal, selector 1145 is also connected to a PE/PMU driver 1385 that amplifies the test signal. In particular output port 1245 is connected to an input 1405 of PE/PMU driver 1385 over conductor 1425. PE/PMU driver 1385 is shared by both the PMU and PE circuitry that is incorporated into IC chip 965. By sharing driver 1385, a PMU test signal may be amplified by the same driver used for PE test signals. For example, by amplifying a PMU test signal with driver 1385, large DC current signals (e.g., 50 milliamp) may be provided to the DUT for testing. By using the same driver to produce relatively large current PMU test signals along with PE test signals, a redundant driver is not needed and chip space is conserved on IC chip 965. Additionally by using the same driver 1385, power consumption is also conserved by reducing the power needs of a redundant driver.

PE control circuitry 1045 provides PE test signals into another input 1445 of PE/PMU driver 1385 via a conductor 1465. An output 1485 of PE/PMU driver 1385 sends the amplified PE test signal (or high current PMU test signal) to the shared output stage 1085. In this arrangement, output stage 1085 includes a resistor 1505 for impedance matching, however, two or more resistors may be included in output stage 1085. For example, resistor 1505 may have a resistance of 50 Ohm for matching a transmission line that connects to the DIB.

Since the output stage 1085 is shared by the PE and PMU circuitry, both PE and PMU test signals are passed through resistor 1505. For example, the higher current PMU test signals and PE test signals are sent from output 1485 of PE/PMU driver 1385 to resistor 1505. Similarly, the lower current PMU test signals are passed from switch 1365 (in a closed position) through a conductor 1525 to resistor 1505. These lower current PMU test signals are passed through the same resistor (resistor 1505) that passes the high current PE test signals and the high current PMU test signal (e.g., 50 milliamp). To account for the resistance of resistor 1505, the signal level of the lower current PMU test signals may be increased by amplifier 1105 or the PMU control circuitry 1025. Other techniques may also be implemented to account for the resistance of resistor 1505. For example the resistance of resistors 1265, 1285, 1305, and 1345 may be reduced (e.g., by 50 Ohm) to account for the resistance of resistor 1505. By sharing the use of output stage 1085, similar to sharing PE/PMU driver 1385, resistor 1505 is commonly used to provide PMU and PE test signals to the DUT, and space on IC chip 965 is conserved.

A number of implementations have been described. Nevertheless, it will be understood that various modifications may be made. Accordingly, other implementations are within the scope of the following claims.

What is claimed is:
1. A semiconductor device tester comprising:
 a PMU driver circuit configured to provide a DC test signal for testing a semiconductor device;
 a first feedback circuit configured to sense a DC test signal directly from an output of the PMU driver circuit, wherein there are no intervening circuit elements between the output of the PMU driver circuit and a point at which the first feedback circuit senses the DC test signal;
 a second feedback circuit electrically connected to the semiconductor device, the second feedback circuit to sense the DC test signal near the semiconductor device;
 a third feedback circuit electrically connected across part of an output signal path of the PMU driver circuit, the third feedback circuit to sense a current output of the PMU driver circuit; and a switch to electrically connect one of the first feedback circuit, the second feedback circuit, and the third feedback circuit to an input of the PMU driver circuit;

wherein the PMU driver circuit is configured to compensate for voltage or current based on which of the first feedback circuit, the second feedback circuit, and the third feedback circuit is electrically connected, via the switch, to the PMU driver circuit.

2. The semiconductor device tester of claim 1, wherein the first feedback circuit comprises a conductor that is electrically connected to the output of the PMU driver circuit.

3. The semiconductor device tester of claim 1, wherein the switch is connected to the output of the PMU driver circuit via the first feedback circuit.

4. The semiconductor device tester of claim 1, wherein the switch is connected to the output of the PMU driver circuit and to the input of the PMU driver circuit via the first feedback circuit.

5. The semiconductor device tester of claim 1, wherein the PMU driver circuit is configured to compare the DC test signal to a signal present at an input of the PMU driver circuit.

6. The semiconductor device tester of claim 1, wherein the PMU driver circuit is configured to adjust the DC test signal output by the PMU driver circuit to compensate for a difference between the DC test signal and a signal present at the input of the PMU driver circuit.

7. The semiconductor device tester of claim 1, wherein the part of the output signal path comprises a resistor.

8. The semiconductor device tester of claim 1, wherein the second feedback circuit is electrically connected to the semiconductor device via at least one circuit element that has an impedance.

9. A method of testing a semiconductor device, the method comprising: electrically connecting, via a switch, one of a first feedback circuit, a second feedback circuit, and a third feedback circuit to an input of a PMU driver circuit, the PMU driver circuit providing a DC test signal for testing a semiconductor device; when the first feedback circuit is electrically connected via the switch to the input of the PMU driver circuit, sensing a DC test signal directly from an output of the PMU driver circuit, wherein there are no intervening circuit elements between the output of the PMU driver circuit and a point at which the first feedback circuit senses the DC test signal; when the second feedback circuit is electrically connected via the switch to the input of the PMU driver circuit, sensing the DC test signal near the semiconductor device; when the third feedback circuit is electrically connected via the switch to the input of the PMU driver circuit, sensing a current output of the PMU driver circuit across part of an output signal path of the PMU driver circuit; and the PMU driver circuit compensating for voltage or current based on which of the first feedback circuit, the second feedback circuit, and the third feedback circuit is electrically connected, via the switch, to the PMU driver circuit.

10. The method of claim 9, wherein compensating comprises comparing the DC test signal to a signal present at the input of the PMU driver circuit.

11. The method of claim 9, wherein compensating comparing a voltage of the DC test signal to a voltage of a signal present at the input of the PMU driver circuit.

12. The method of claim 9, wherein compensating comprises adjusting the DC test signal provided by the PMU driver circuit to compensate for a difference between the DC test signal and a signal present at the input of the PMU driver circuit.

13. A semiconductor device tester, comprising:
a PE stage configured to provide an alternating current (AC) test signal for testing a semiconductor device; and
a PMU stage configured to provide a direct current (DC) test signal for testing the semiconductor device, the PMU stage comprising:
a PMU driver circuit configured to receive a DC input signal and to produce the DC test signal,
a first feedback circuit configured to sense the DC test signal directly from an output of the PMU driver circuit, wherein there are no intervening circuit elements between the output of the PMU driver circuit and a point at which the first feedback circuit senses the DC test signal;
a second feedback circuit electrically connected to the semiconductor device, the second feedback circuit to sense the DC test signal near the semiconductor device;
a third feedback circuit electrically connected across part of an output signal path of the PMU driver circuit, the third feedback circuit to sense a current output of the PMU driver circuit; and
a switch to electrically connect one of the first feedback circuit, the second feedback circuit, and the third feedback circuit to an input of the PMU driver circuit;
wherein the PMU driver circuit is configured to compensate for voltage or current based on which of the first feedback circuit, the second feedback circuit, and the third feedback circuit is electrically connected, via the switch, to the PMU driver circuit.

14. The semiconductor tester of claim 13, wherein the output signal path comprises an impedance element electrically connected between the output of the PMU driver circuit and the semiconductor device.

15. The semiconductor tester of claim 13, wherein the PE stage is configured to provide a PMU current test signal to the semiconductor device under test and is also configured to sense a response from the semiconductor device under test.

16. The semiconductor device tester of claim 13, wherein the PMU driver circuit is configured to compensate by comparing the DC test signal to a signal present at the input of the PMU driver circuit.

17. The semiconductor device tester of claim 13, wherein the PMU driver circuit is configured to compensate by comparing a voltage of the DC test signal to a voltage of a signal present at the input of the PMU driver circuit.

18. The semiconductor device tester of claim 13, wherein the PMU driver circuit is configured to compensate by adjusting the DC test signal provided by the PMU driver circuit to compensate for a difference between the DC test signal and a signal present at the input of the PMU driver circuit.

* * * * *

UNITED STATES PATENT AND TRADEMARK OFFICE
CERTIFICATE OF CORRECTION

| | | |
|---|---|---|
| PATENT NO. | : 7,508,228 B2 | Page 1 of 1 |
| APPLICATION NO. | : 11/321288 | |
| DATED | : March 24, 2009 | |
| INVENTOR(S) | : Ernest P. Walker | |

It is certified that error appears in the above-identified patent and that said Letters Patent is hereby corrected as shown below:

On the Title Page:
Item (56) References Cited, Column 2 (U.S. Patent Documents), Line 4
delete "324/764" and insert -- 324/765 --, therefor.

In the Specifications:
Column 1, Line 4 insert the following paragraph:

-- CROSS-REFERENCE TO RELATED APPLICATION

This patent application claims priority to U.S. provisional application no. 60/637,975, filed December 21, 2004. --

Signed and Sealed this
Twenty-first Day of February, 2012

David J. Kappos
*Director of the United States Patent and Trademark Office*